United States Patent [19]

Sasaki et al.

[11] Patent Number: 5,021,944
[45] Date of Patent: Jun. 4, 1991

[54] SEMICONDUCTOR MEMORY HAVING REDUNDANCY CIRCUIT FOR RELIEVING DEFECTS

[75] Inventors: Katsuro Sasaki; Katsuhiro Shimohigashi; Shoji Hanamura, all of Tokyo, Japan

[73] Assignee: Hitachi, Ltd., Tokyo, Japan

[21] Appl. No.: 376,245

[22] Filed: Jul. 6, 1989

[30] Foreign Application Priority Data

Jul. 8, 1988 [JP] Japan .................. 63-168708

[51] Int. Cl.⁵ .................. G11C 7/00; G11C 29/00; G06F 11/00
[52] U.S. Cl. .................. 365/200; 371/10.1
[58] Field of Search .................. 365/200, 230.03; 371/10

[56] References Cited

U.S. PATENT DOCUMENTS

| 4,389,715 | 6/1983 | Eaton, Jr. et al. | 365/200 |
| 4,542,486 | 9/1985 | Anami et al. | 365/230.03 |
| 4,656,610 | 4/1987 | Yoshida et al. | 365/200 |

FOREIGN PATENT DOCUMENTS

| 164094 | 9/1983 | Japan | 365/200 |
| 46497 | 2/1987 | Japan | 365/200 |

OTHER PUBLICATIONS

Sasaki et al., "A 9ns 1Ms CMOS SRAM", 1989 IEEE International Solid-State Circuits Conference, Session 2, Feb. 15, 1989, pp. 34-35.
Fitzgerald et al., "Circuit Implementation of Fusible Redundant Addresses on RAMs for Productivity Enhancement", IBM Jrnl. of Research Development, vol. 24, No. 3, May 1980, pp. 294-297.

*Primary Examiner*—5
*Assistant Examiner*—Michael A. Whitfield
*Attorney, Agent, or Firm*—Fay, Sharpe, Beall, Fagan, Minnich & McKee

[57] ABSTRACT

A method and apparatus for quickly masking defective memory elements with substitute memory elements includes first and second memory blocks. The first memory block includes a first memory array and a second spare memory array. The second memory block includes a second memory array and a first spare memory array. A first word from the first memory array is selected concurrently with a first substitute word from the first spare memory. An address signal is decoded and then compared with data representative of a defective word. In the event it is determined, as a result of this comparison, that the first word is defective, the first substitute word is then communicated to a common data bus. Alternatively, the first word is communicated to the common data bus.

16 Claims, 9 Drawing Sheets

| | WHEN SPARE WORD IS LISTED | WHEN SPARE WORD IS NOT LISTED |
|---|---|---|
| S1= | y1 | y2 |
| S1= | y2 | y1 |

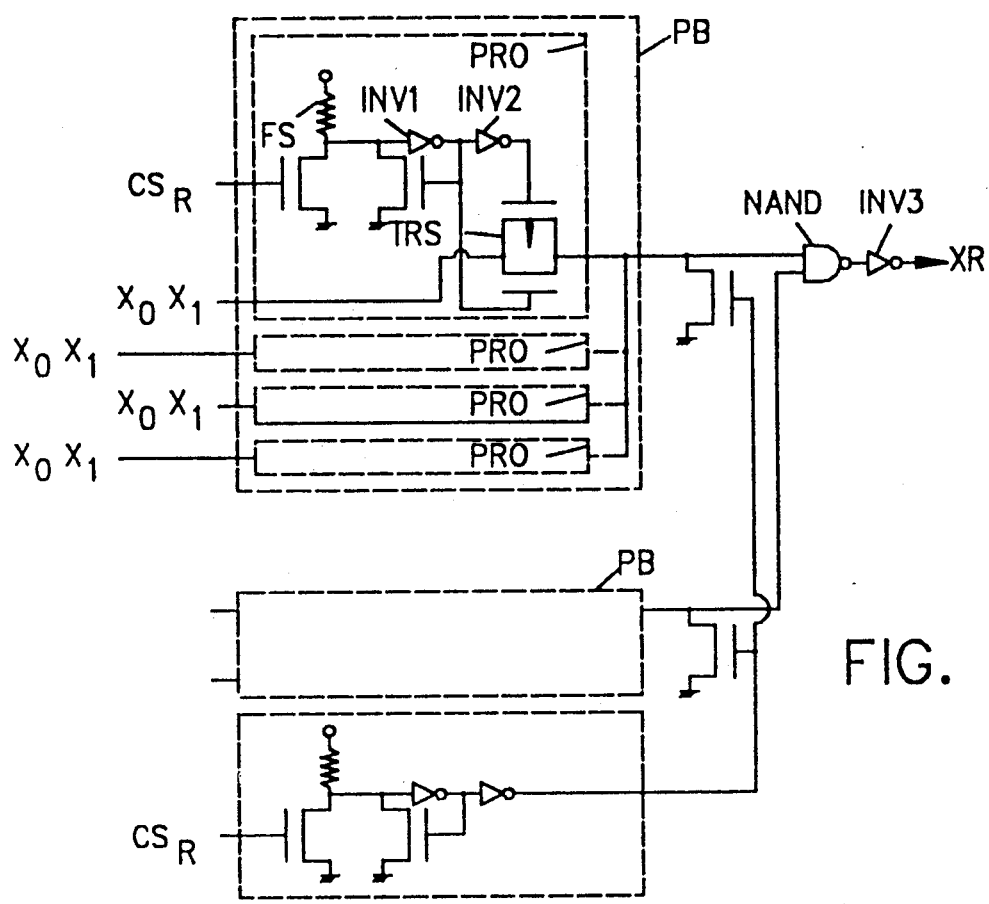
FIG. 4
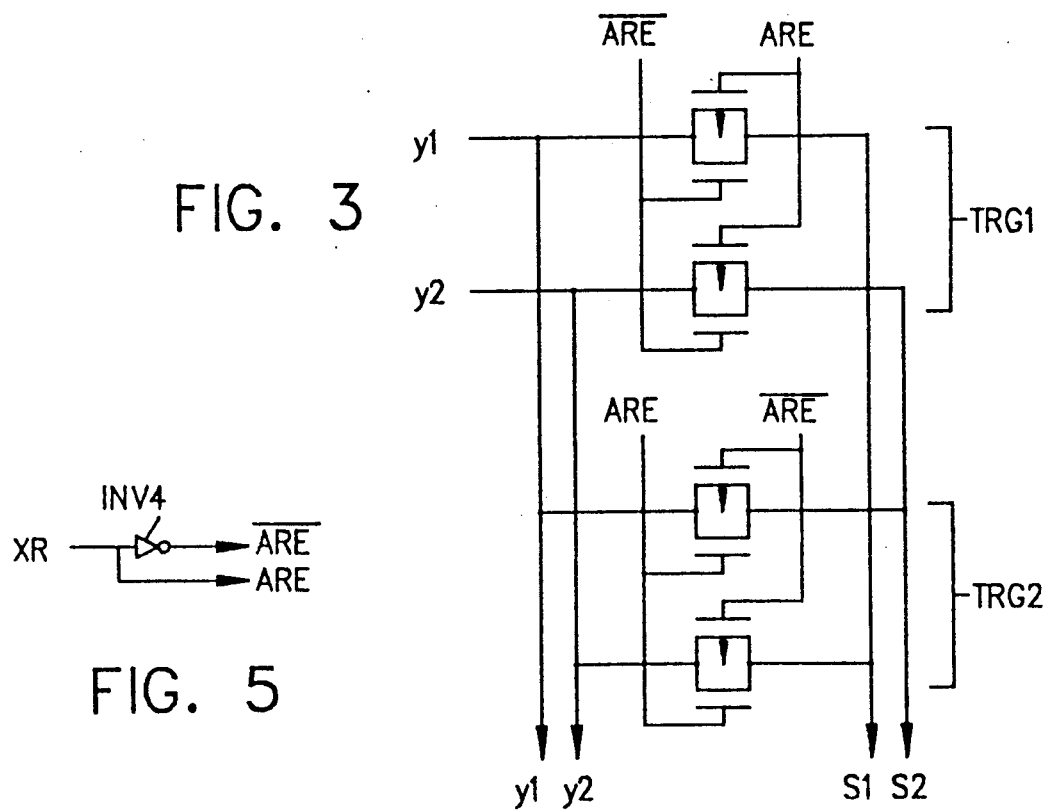
FIG. 3
FIG. 5

|       | WHEN SPARE WORD IS NOT USED | WHEN FIRST SPARE WORD WRi(i=1,2,3,4) IS USED | WHEN SECOND SPARE WORD WRib(i=1,2,3,4) IS USED | WHEN THIRD SPARE WORD WRic(i=1,2,3,4) IS USED |
|-------|------|------|------|------|
| S1=   | y1   | y4   | y3   | y2   |
| S2=   | y2   | y1   | y4   | y3   |
| S3=   | y3   | y2   | y1   | y4   |
| S4=   | y4   | y3   | y2   | y1   |

SEMICONDUCTOR MEMORY HAVING REDUNDANCY CIRCUIT FOR RELIEVING DEFECTS

BACKGROUND OF THE INVENTION

This invention relates generally to a semiconductor memory device such as a static type random access memory device. The invention more particularly relates to a circuit form suitable for reading out, at a high speed, data from a spare memory cell of a redundant spare memory block for replacing or masking defective memory cells in the memory device.

An earlier, exemplary, redundancy circuit form for relieving defective bits is disclosed in Japanese Patent Laid-Open Nos. 164096/1983 and 46497/1987. FIG. 2 of Japanese Patent Laid-Open No. 164096/1983 discloses a defect relieving technique of a dynamic type random access memory device using 1-transistor type memory cells. The illustration is a circuit form wherein a defective memory cell of an A mat in one of the memory blocks is activated by an address signal, and at the same time, a redundant spare memory cell of the A mat in the other memory block is activated so that only the sense amplifier in this other memory block senses a bit line voltage difference and amplifies it. However, FIG. 2 of this prior art reference teaches defect relief solely by the selective activation of sense amplifiers in the memory blocks, but does not disclose a high speed defect relieving redundancy circuit wherein the memory cell information is read outside the memory blocks.

Japanese Patent Laid-Open No. 46497/1987 similarly discloses a defect relieving technique for a dynamic type random access memory. The described circuit is of a form wherein a normal memory array and a spare memory array for relieving this normal memory array are disposed in one of the memory blocks. Another normal memory array and a similar spare memory array are disposed also in the other memory block, the operation of an address decoder for making access to the normal memory array is inhibited when an access is made to a defective memory cell in the normal memory array while the access is made to the spare memory array for relieving the normal memory array. Information from this spare memory array is read out to the outside of the memory block.

The defect relieving technique described in Japanese Patent Laid-Open No. 46497/1987 involves the steps of detecting the coincidence of a defective memory cell in the normal memory array with an address signal after the address signal is supplied from outside the memory device, inhibiting the operation of the address decoder for making access to the normal memory array on the basis of this coincidence detection then making access to the spare memory array and reading out the information from this spare memory array to the outside of the memory block. The access time relating to the read-out of the information from the spare memory for relieving defects is thereby disadvantageously slow.

The present invention remedies the aforenoted problems, and others, and is directed to provide a memory device having a reduced delay of the access time relating to the information read-out operation from the redundant spare memory.

SUMMARY OF THE INVENTION

The present system includes a first memory array block having a first memory array including a plurality of memory cells and a first spare memory array including a plurality of memory cells. A second memory array block has a second memory array including a plurality of memory cells and a second spare memory array including a plurality of spare memory cells.

A first word driver means is provided for selecting a first word line of the first memory array of the first memory array block. Similarly, a second word driver means selects a second word line of the second memory array of the second memory array block, a first spare word driver means selects a first spare word line of the first spare memory array of the first memory array block, and a second spare word driver means selects a second spare word line of the second spare memory array of the second memory array block. A first sense amplifier senses information read out from the first memory array block, and a second sense amplifier senses information read out from the second memory array block. Data buses are connected to the outputs of the first and second sense amplifiers.

A first data line is connected between the first memory array block and the input of the first sense amplifier, and a second data line is connected between the second memory array block and the input of the second sense amplifier. A first column switch means transmits information of one bit line of a bit line group, connected commonly to the first memory array of the first memory array block and to the first spare memory array block to the first data line. A second column switch means transmits information of one bit line of a bit line group, connected commonly to the second memory array of the second memory array block and to the second spare memory array block, to the second data line. A first column driver means controls the information transmission of the first column switch means. A second column driver means controls the information transmission of the second column switch means. A control unit controls sense operations of the first and second sense amplifiers.

When the first word driver means selects the first word line of the first memory array of the first memory array block, the second spare word driver means simultaneously selects the second spare word line of the second spare memory array of the second memory array block. When the first column driver means permits an information transmission operation of the first column switch means, the second column driver means permits the information transmission operation of the second column switch means, so that the information from the first memory array of the first memory array block, which might be defective, is transmitted to the first data line and the information from the second spare memory array, of the second memory array block, is transmitted to the second data line.

During defect relief or replacement, the control unit inhibits the sense operation of the first sense amplifier, but permits the sense operation of the second sense amplifier. In this way the information from the second spare memory array of the second memory block is transmitted to the second data line, and can be read out to the data bus through the second sense amplifier.

During defect non-relief or non-replacement, the control unit permits the sense operation of the first sense amplifier, but inhibits the sense operation of the second sense amplifier. In this fashion, the read-out information from the first memory array of the first memory array block transmitted to the first data line can be read out to the data bus through the first sense amplifier.

As described above, during both defect non-relief and defect relief, the read-out information from the first memory array of the first memory array block and the spare read-out information from the second spare memory array of the second memory array block can be transmitted to the input of the first sense amplifier and to the input of the second sense amplifier, respectively, through the first and second column switch means and the first and second data lines, respectively.

Accordingly, even when the first and second data lines have a relatively large stray capacitance, charge or discharge of the stray capacitance is nearly completed by the read-out information and the spare read-out information before the switch of the first and second sense amplifiers is completed during defect non-relief or defect relief. Therefore the access time relating to the read-out information and the spare read-out information to the data bus can be shortened during defect non-relief and defect relief.

Unlike the present invention, if signal transmissions of the first column switch and the second column switch are switched on a basis of defect non-relief and defect relief, a considerable period of time is necessary for charging or discharging the stray capacitances of the first data line and the second data line, and a delay necessarily follows in the access time for the read-out operation.

If signal transmissions of the first word driver means and the second spare word driver means are switched on a basis of detected non-relief and detected relief, a considerable period of time is necessary for charging and discharging the stray capacitance of the first word line and the second spare word line.

An advantage of the present invention is the provision of a system with which defective memory elements may be masked and replaced with substitute, non-defective memory elements.

Another advantage of the present invention is the provision of a defective memory element replacement system which accomplishes the replacement quickly and reliably.

Yet another advantage of the present system is the provision of a defective memory element replacement system which is transparent to a memory application.

Further advantages will become apparent to one of ordinary skill in the art upon a reading and understanding of the subject specification.

BRIEF DESCRIPTION OF THE DRAWINGS

FIG. 3 shows an example of a control unit 3 in FIG. 1;

FIGS. 4 and 5 show circuits for generating relief detection signals ARE, $\overline{ARE}$ used for the control unit 3 in FIG. 3;

DETAILED DESCRIPTION OF THE PREFERRED AND ALTERNATE EMBODIMENTS

Figures 1, 2:
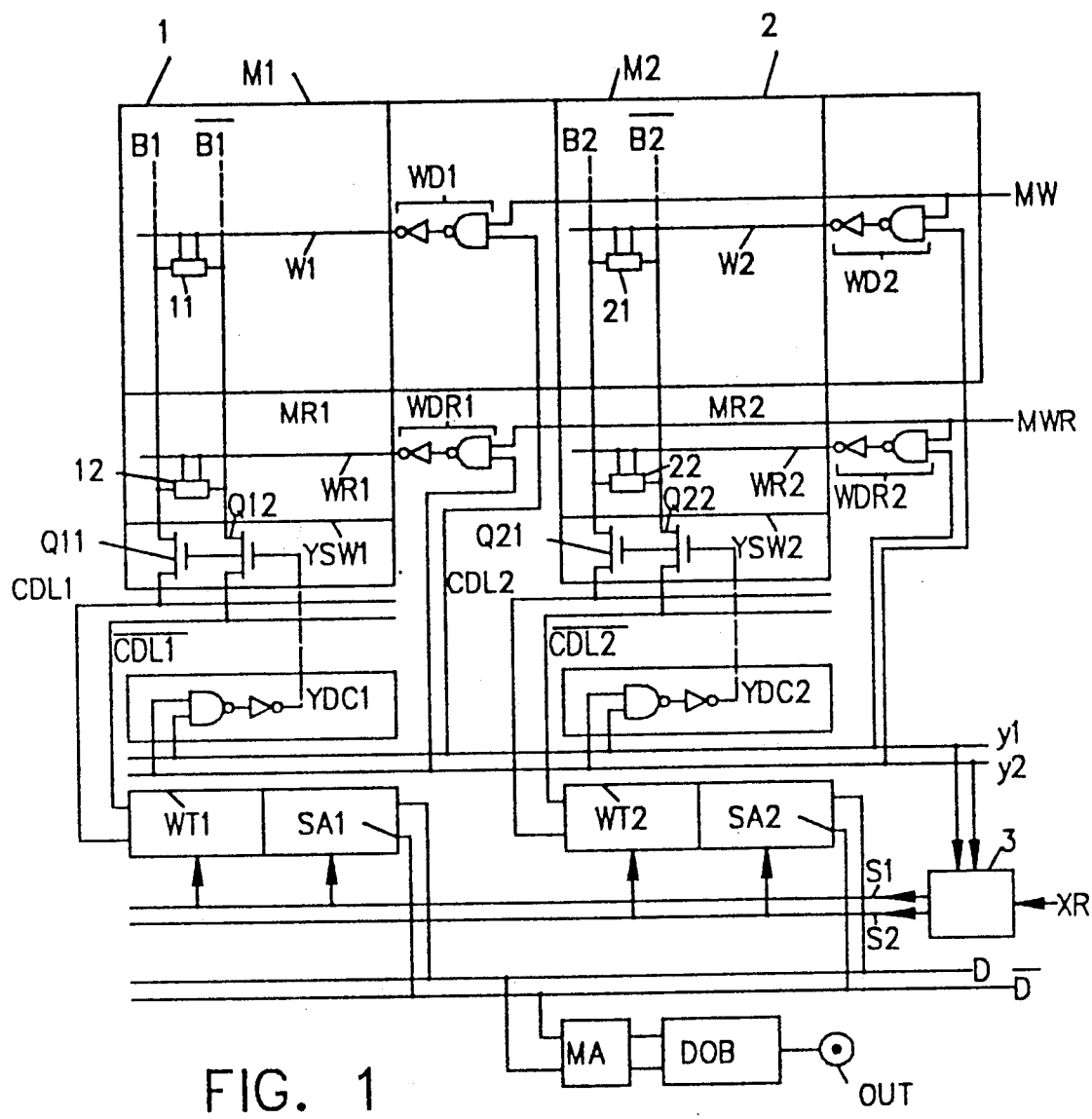
FIG. 1 is a block diagram of SRAM in accordance with one embodiment of the present invention.
FIG. 2 is a table showing a relationship between memory array block selection signals y1, y2 of FIG. 1 and sense amplifier selection signals S1, S2.

The block diagram of a static type random access memory (hereinafter referred to as "SRAM") in accordance with the present invention will be explained with reference to FIG. 1. Symbols M1 and M2 represent divided memory arrays, each containing a plurality of memory cells. Symbol MW represents a main word line for an X-system address which is common to the divided memory arrays M1 and M2; W1 and W2 are word lines of the memory arrays M1 and M2, respectively; and WD1 and WD2 are word decoder drivers. MR1 and MR2 are spare memory arrays for relieving the defects of the memory array M1 and M2, respectively, and each includes a plurality of memory cells. In FIG. 1, each includes one spare word line WR1, WR2. Symbol MWR represents a spare main word line and WDR1 and WDR2 are spare word decoder drivers.

Symbols y1 and y2 represent address signal lines or pre-decoded address signal lines for the memory array block selection, which are inputted to the word drivers WD1, WD2, the spare word drivers WDR1, WDR2 and the Y (column) decoder drivers YDC1, YDC2. Symbols S1 and S2 represent signals for selecting sense amplifiers SA1, SA2 and write circuits WT1, WT2.

The first memory array M1 of the first memory array block 1 contains a plurality of memory cells and its one example is represented by a static type flip-flop 11. When the word line W1 is at the high level, complementary digital signals are read out from this static type memory cell 11 to a pair of bit lines B1, $\overline{B1}$. The spare memory array block 1 MR1 of the first spare memory array, too, includes a plurality of spare memory cells and its one example is represented by a static type flip-flop 12. When the spare word line WR1 is at a high level, complementary digital signals are read out from this static type spare memory cell 12 to the bit line pair B1, $\overline{B1}$ described above. In this manner, the bit line pair B1, $\overline{B1}$ are connected commonly to the static type memory cell 11 and the static type spare memory cell 12.

The static type flip-flop 21 of the second memory array M2 of the second memory array block 2, the static type spare flip-flop 22 of the second spare memory array MR2 and the bit line pair B2, $\overline{B2}$ have the same construction as described above.

Though not shown in FIG. 1, a plurality of bit line pairs similar to the bit line pair B1, $\overline{B1}$ are disposed in the first memory array block 1 and a plurality of bit line pairs similar to the bit line pair B2, $\overline{B2}$ are disposed in the second memory array block 2.

The signal of the bit line pair B1, $\overline{B1}$ is transmitted to common data line pair CDL1, $\overline{CDL1}$ through MOSFETs Q11, Q12 of the column switch YSW1 and the signal of the bit line pair B2, $\overline{B2}$ is transmitted to the common data line pair CDL2, $\overline{CDL2}$ through MOSFETs Q21, Q22 of the column switch YSW2.

Sense amplifier selection signals S1, S2 are generated from the memory array block selection signals y1, y2 described above by the control unit 3 in accordance with FIG. 2. A circuit example of the control unit 3 for accomplishing FIG. 2 is shown in FIG. 3. In FIG. 3, symbol ARE represents a relief detection signal, which is at the high level when a spare word is used and is at the low level when the spare word is not used. When the spare word is not used, ARE is at the low level while $\overline{ARE}$ is at the high level. And a transfer gate TRG1 is conductive while TRG2 is non-conductive. Therefore, S1=y1 and S2=y2. On the other hand, when the spare word is used, ARE is at the high level while $\overline{ARE}$ is at the low level so that TRG1 is non-conductive while TRG2 is conductive and S1=y2 and S2=y1.

The relief detection signals ARE, $\overline{ARE}$ suitably realized by the circuit construction shown in FIGS. 4 and 5, for example. In FIG. 4, symbol PRO represents one defect relief program circuit. The program is prepared so as to disconnect or blow fuses FS as the program elements corresponding to the addresses $\overline{x0}$, $\overline{x1}$ of the defect to be relieved so that the input and output of an invertor INV1 are at the low and high levels and the output of an invertor INV2 is at the low level. In this manner the transfer gate TRS is made to be conductive and desired address signals $\overline{x0}$ $\overline{x1}$ are outputted. Symbol PB represents a block gathering a plurality of program circuits PRO and prepares the program so as to output the address signal corresponding to the relief address inside the block when defect relief is made. There is thus obtained finally a product signal $X_R$ corresponding to the defect address to be relieved Next, the relief detection signals ARE and $\overline{ARE}$ can be obtained from the output and input of the invertor INV4 shown in FIG. 5.

Next, the defect relief operation of the present invention will be described with reference to FIG. 1. It will now be assumed that the main word line MW is selected The spare main word line MWR is selected irrespective of the X system address signal and the address signals y1 and y2. Assuming that the address signal y1 is selected and the address signal y2 is not selected, the word line W1 and the spare word line WR2 are selected by the word driver WD1 and the spare word driver WDR2, respectively. Here, the sum signal of y1 and y2 is inputted to the y decoders YDC1, YDC2 for the Y (column) system address, a pair of bit lines (among the bit line groups connected commonly to the memory array M1 and to the spare memory array MR1) is selected by the Y switch gate YSW1 and at the same time, a pair of bit lines (among the bit line groups connected to the memory array M2 and to the spare memory array MR2) is selected by the Y switch gate YSW2.

In other words, the read data of the memory cell of one bit associated with the word line W1 is transmitted to the input of the sense amplifier SA1 through the Y switch gate YSW1 and the common data lines CDL1, $\overline{CDL1}$ and at the same time, the read data of the spare memory cell of one bit associated with the spare word line WR2 is inputted to the input of the sense amplifier SA2 through the Y switch gate YSW2 and the common data lines CDL2, $\overline{CDL2}$. Therefore, the data of the memory cell associated with the word line W1 is outputted when the sense amplifier SA1 is selected by the signal S1 and the data of the spare memory cell associated with the spare word line WR2 is outputted when the sense amplifier SA2 is selected by the signal S2, to the data buses D, $\overline{D}$ in the form of the complementary signals (that is, in the form of differential signals). Accordingly, the data associated with the word line W1 is outputted when relief is not made and the data associated with the spare word line WR2 is outputted when defect relief is made. This means that when any defect exists on the word line W1, the spare word line WR2 operates as a relief word line.

At this time the relief detection signals ARE, $\overline{ARE}$ are subjected to the gate delay of three to four stages of the transfer gate TRS, the NAND circuit NAND and the invertor circuits INV3, INV4 and to the wiring delay in FIGS. 4 and 5, but this delay time is at most several nanoseconds and the level of the selection signal S1 or S2 is determined before the read data from the memory cell arrives at the respective sense amplifier SA1, SA2. Accordingly, the delay of the access time does not occur even when the spare word is used and the high speed memory read operation can be maintained.

The complementary signals thus read out to the data buses D, $\overline{D}$ are finally transmitted to the output terminal 4 of SRAM through the main amplifier MA and the data output buffer circuit DOB.

On the other hand, as to the data write operation, the write circuit WT1 is selected by the selection signal S1 and written into the bit of the word W1 at the time of non-relief and at the time of relief, the write circuit WT2 is selected by the selection signal S2 and written into the bit of the spare word WR2.

When the address signal y2 is selected but y1 is not selected, the spare word line WR1 operates as the relief word line of the word line W2 entirely in accordance with the same operation principle as described above allowing a relief circuit free from the access delay can be accomplished.

FIG. 1 shows the defect relief system which has one spare word line, that is, which can relieve only one defect word line in the memory array block, and which is free from the access delay. Next, the defect relief system capable of relieving three defective word lines and free from the access delay will be explained as SRAM of the second embodiment.

Figure 6:
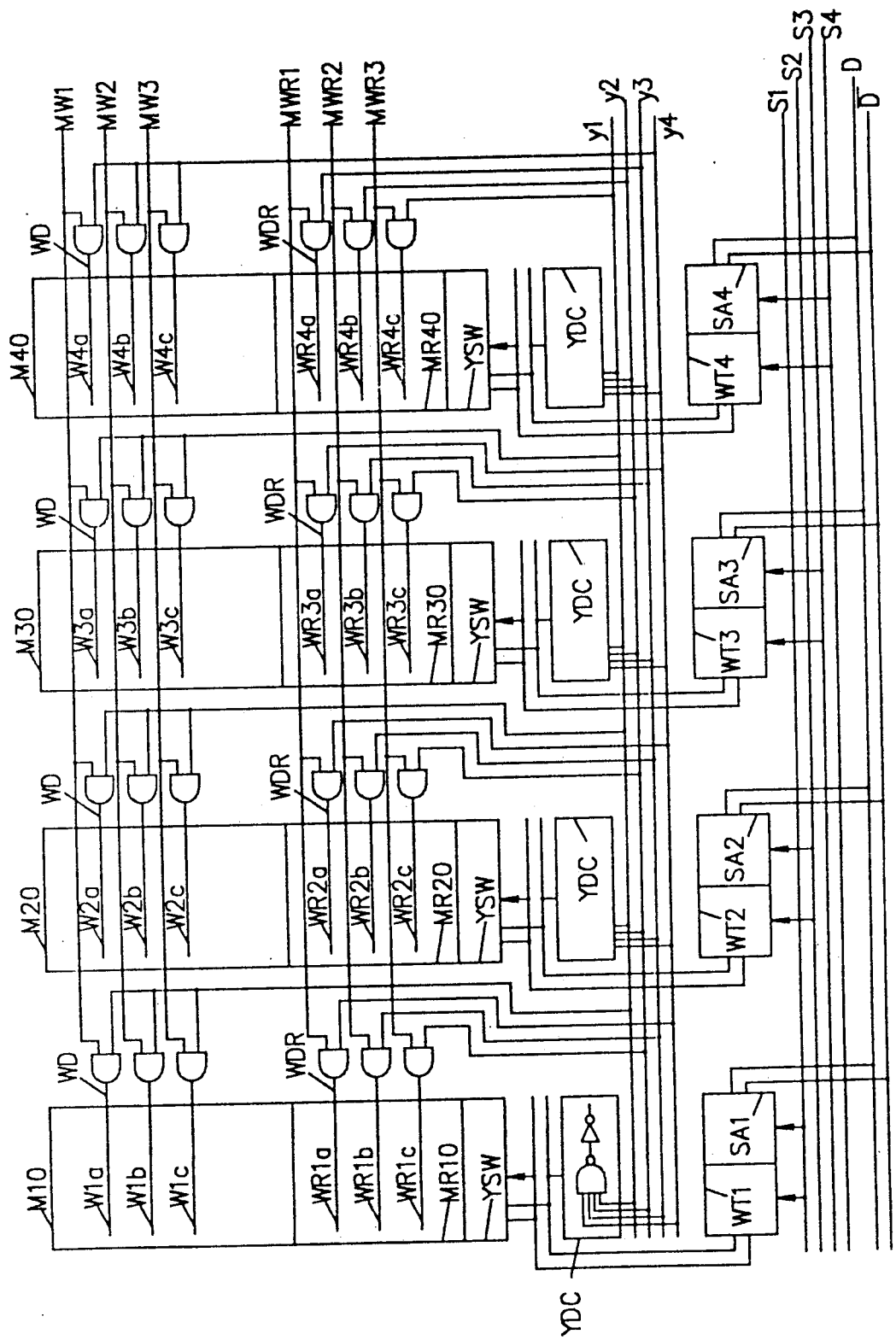
FIG. 6 is a block diagram showing a SRAM of another embodiment of the present invention.

In SRAM shown in FIG. 6, M10, M20, M30 and M40 are divided memory array blocks and MR10, MR20, MR30 and MR40 are spare memory array blocks. Three spare word lines $WR_{1a}$, $WR_{1b}$, $WR_{1c}$, $WR_{2a}$, $WR_{2b}$, $WR_{2c}$, ... are disposed to each of these spare memory array blocks MR10, MR20, MR30, MR40. Symbols MW1, MW2, MW3 are main word lines extending commonly to each memory array block M10, M20, M30, M40 and always one line is selected in accordance with the address signal. Symbols MWR1, MWR2, MWR3 are main word lines for the spare memory array blocks MR10, MR20, MR30 and MR40 and they are always selected in the same number as the number of word lines to be relieved. If the relief word line is one, for example, only MWR1 is selected and if the relief word line are two, MRW1 and MWR2 and after three MRW1, MRW2 and MRW3 are always selected, respectively, during the chip selection period. Symbols $W_{ia}$, $W_{ib}$, $W_{ic}$ (i=1, 2, 3) represent word lines and symbols $WR_{ia}$, $WR_{ib}$, $WR_{ic}$, (i=1, 2, 3) represent spare word lines. These word lines are selected by word decoders WD, WDR consisting of AND circuits. The AND circuit comprises, for example, the combination of the NAND circuit and the invertor that are shown by WD1, WD2 and WDR2 in FIG. 1. The word decoder is suitably formed on one stage of a NOR circuit and in this case, the word is selected when all the input signals are at the low level. Symbols y1, y2, y3 and y4 represent address signal lines, or pre-decoded address signal lines, for selecting the memory array blocks and only one signal line among these y1 to y4 is always at the high level.

Symbol YDC represents a Y decoder and YSW is a bit line selection gate. Symbols WT1-WT4 are write circuits and SA1-SA4 are sense amplifiers. Symbols S1, S2, S3, S4 represent sense amplifier and write circuit selection signals and D and $\overline{D}$ are data buses.

Figures 7, 9:
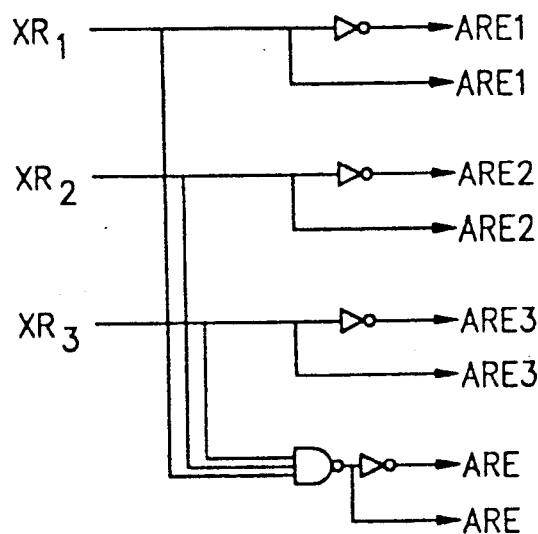
FIG. 7 is a table showing a logical relationship between memory array block selection signals and sense amplifier selection signals.
FIG. 9 shows a circuit for generating the signals ARE1, $\overline{ARE1}$, ARE2, $\overline{ARE2}$, etc., used in the circuit example of FIG. 8.
Figure 8:
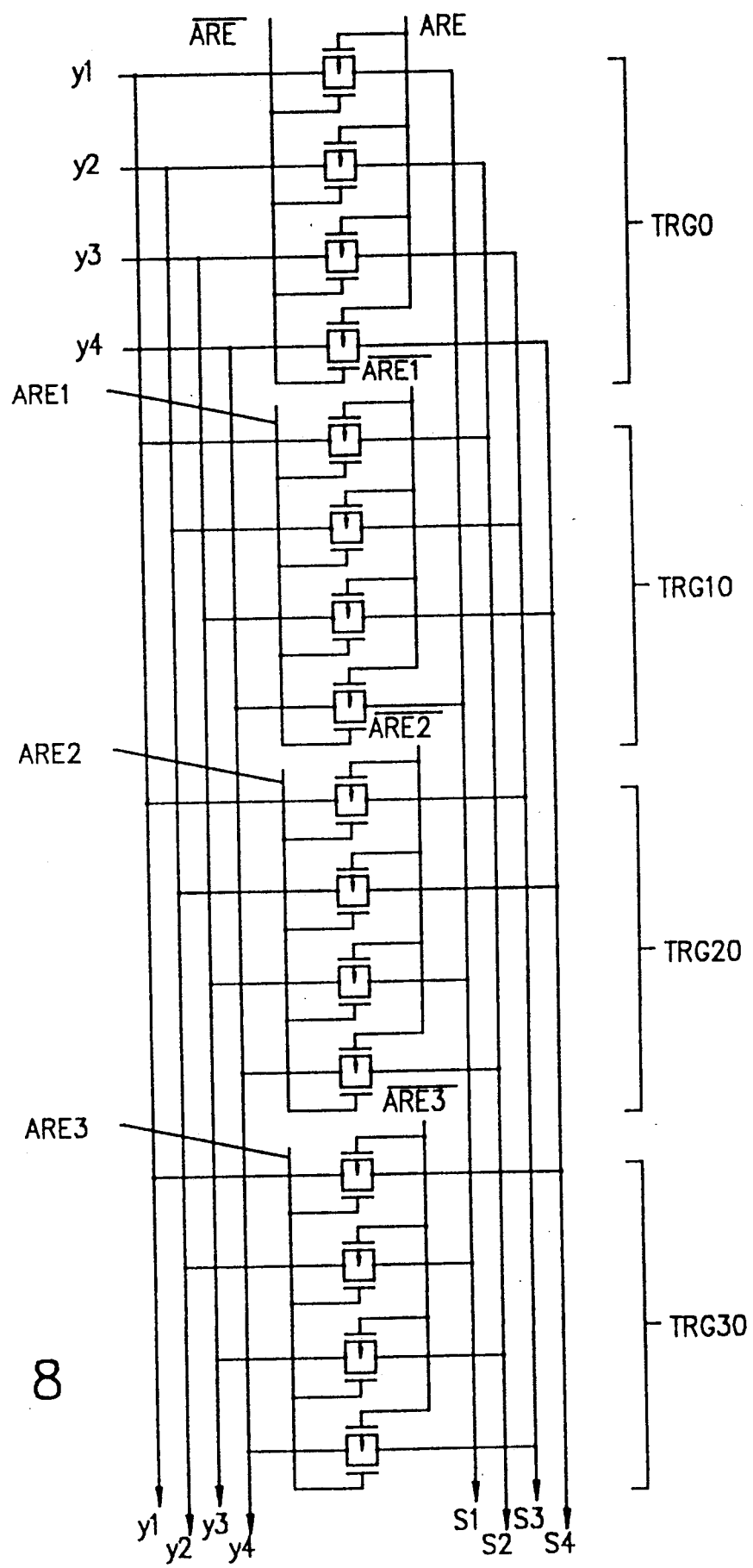
FIG. 8 shows a circuit example for accomplishing the logical relation of FIG. 7.

The signals S1-S4 are generated from the address signals or pre-decoded address signals y1-y4 in accordance with FIG. 7. A circuit example for accomplishing the logic of FIG. 7 is shown in FIG. 8. In FIG. 8, ARE1, ARE2 and ARE3 are first, second and third spare word selection signals, respectively, and they are at the high level when the respective words are selected and at the low level then the respective words are not selected. $\overline{ARE1}$, $\overline{ARE2}$, and $\overline{ARE3}$ are inversion signals of ARE1, ARE and ARE3, respectively.

Symbol ARE represents the sum signal of ARE1, ARE2 and ARE3 and when any one of the spare words is selected, it is at the high level and when none of the spare words are selected, it is at the low level.

When none of the spare words are selected, only the transfer gate TRG0 becomes conductive, and when one of the first, second and third spare words is used for relieving defects, only the corresponding one transfer gate TRG10, TRG20 and TRG30 is conductive and the logic shown in FIG. 7 can be accomplished.

ARE, AREi and $\overline{AREi}$ (i=1, 2, 3) can be obtained by the circuit shown in FIG. 9. In FIG. 9, XR1, XR2 and XR3 are the product signals of the first, second and third word line addresses to be relieved, and can be obtained by use of three circuits shown in FIG. 4, for example.

Next, the defect relief operation will be explained with reference to FIG. 6. It will be now assumed that a defect exists in the word line W1a and it is relieved by the first spare word line.

$W_{ia}$ is selected by MW1 and y1 with MWR1 being selected normally and at this time, WR$_{2a}$ is selected simultaneously by MWR1 and y1. The product XR$_1$ of the word address of the first defect W$_{1a}$ is set to the high level by the circuit of FIG. 4 are ARE, $\overline{ARE1}$ are set to the high level while $\overline{ARE}$, $\overline{ARE1}$ are set to the low level by the circuit shown in FIG. 9. At this time ARE2 and ARE3 are at the low level while $\overline{ARE2}$, $\overline{ARE3}$ are at the high level. Accordingly, only the transfer gate TRG10 in the circuit of FIG. 8 becomes conductive and S2=y1. In other words, the sense amplifier SA2 and the write circuit WT2 are selected in place of SA1 and WT1. Since the Y decoder YDC selected simultaneously four memory array blocks by the sum signal of y1-y4, WR$_{2a}$ operates as the spare word of W$_{1a}$.

If W$_{1b}$ has the defect in addition to W$_{1a}$, MWR1 and MWR2 are selected normally. At this time, WR$_{3b}$, too, is selected normally by the block selection signal y1 in addition to the spare word WR$_{2a}$. Next, TRG20 of FIG. 8 becomes conductive by the address of the second spare word W$_{1b}$, S3=y1 and WT3 and SA3 are selected in place of WT1 and SA1, respectively. Thus, the spare word WR$_{3b}$ operates as the spare word of W$_{1b}$.

Furthermore, if W$_{1c}$ has the defect, WR$_{4c}$ operates as the spare word of W$_{1c}$ in exactly the same way.

The spare word is allotted in accordance with the same procedures when other memory array blocks M20, M30 and M40 have the defective words. It can be confirmed easily by following the procedures described above that the operation is exactly the same as described above when three defective words exist in the different memory array blocks.

When these defect reliefs are carried out, the delay time resulting from the address switch is at most up to several nano-seconds and in accordance with the defect relieving system of the present invention which selects the sense amplifiers, defect relief can be attained without the access delay.

The present invention can make memory read-out without being affected by the delay time caused by the address switch which is made for defect relief. In other words, the present invention accomplishes defect relief without a resultant delay in access time.

The invention has been described with reference to the preferred and alternate embodiments. Certain other obvious modifications will be apparent to one of ordinary skill in the art upon a reading of the subject specification. It is intended that any such modification be included insofar as it comes with the scope of the appended claims or the equivalents thereto.

What is claimed is:

1. A memory comprising:

a first memory array block having a first memory array including a plurality of memory cells and a first spare memory array including a plurality of spare memory cells;

a second memory array block having a second memory array including a plurality of memory cells and a second spare memory array including a plurality of spare memory cells;

first word driver means for selecting a first word line of said first memory array of said first memory array block;

second word driver means for selecting a second word line of said second memory array of said second memory array block;

first spare word driver means for selecting a first spare word line of said first spare memory array of said first memory array block;

second spare word driver means for selecting a second spare word line of said second spare memory array of said second memory array block;

a first sense amplifier for sensing the data read out from said first memory array block;

a second sense amplifier for sensing the data read out from said second memory array block;

a data bus connected to an output of said first sense amplifier and to an output of said second sense amplifier;

a first data line connected between said first memory array block and an input of said first sense amplifier;

a second data line connected between said second memory array block and an input of said second sense amplifier;

first column switch means for transmitting said data on one bit line of a bit line group, connected commonly to said first memory array of said first memory array block and to said first spare memory array of said first memory array block, to said first data line;

second column switch means for transmitting said data on one bit line of a bit line group, connected commonly to said second memory array of said second memory array block and to said second spare memory array of said second spare memory array block, to said second data line;

first column driver means for controlling data transmission of said first column switch means;

second column driver means for controlling data transmission of said second column switch means; and a control unit for controlling the sense operation of said first sense amplifier and the sense operation of said second sense amplifier; wherein when said first word line driver means selects said first word line of said first memory array of said first memory array block in response to a memory array block selection signal, said second spare word driver means lets said second spare word line of said second spare memory array of said second memory array block be concurrently selected and when said first column driver means permits the data transmission operation of said first column switch means in response to said memory array block selection signal, in response to said memory block selection signal said second column driver means permits the data transmission operation of said second column switch means so that the data from said first memory array of said first memory array block is transmitted to said first data line and the data from said second spare memory array of said second memory array block is concurrently transmitted to said second data line; wherein, during deflect relief, said control unit inhibits the sense operation of said first sense amplifier but permits the sense operation of said second sense amplifier in response to said memory array block selection signal so that the data from said second spare memory array of said second memory array block, that is transmitted to said second data line, is read out to said data bus through said second sense amplifier; and wherein, during defect non-relief, said control unit permits the sense operation of said first sense amplifier but inhibits the sense operation of said second sense amplifier in response to said memory array block selection signal so that the data from said first memory array of said first memory array block, that is transmitted to said first data line, is read out to said data bus through said first sense amplifier.

2. A memory according to claim 1, wherein each of said plurality of memory cells of said first and second memory arrays of said first and second memory array blocks and each of said plurality of spare memory cells of said first and second spare memory arrays of said first and second spare memory array blocks include static type flip-flops.

3. A memory according to claim 1, wherein said first word driver means is driven by a signal of a main word line and by an address signal for selecting said first memory array block;

said second word driver means is driven by said signal of said main word line and an address signal for selecting said second memory array block;

said first spare word driver means is driven by a signal of a spare main word line and said address signal for selecting said second memory array block; and said second spare word driver means is driven by said signal of said spare main word line and said address signal for selecting said first memory block.

4. A semiconductor memory device comprising:
a first memory block including,
a first memory array having a plurality of memory cells arranged as a series of word elements, and
a first spare memory array having a plurality of spare memory cells arranged as a series of word elements;

a second memory block including,
a second memory having a plurality of memory cells arranged as a series of word elements, and
a second spare memory having a plurality of spare memory cells arranged as a series of word elements;

means for selecting a first word element from the first memory array in response to a memory array block selection signal;

first outputting means for outputting the first word element to a first intermediate bus in response to said memory block selection signal;

means for selecting a second word element from the second memory array in response to said memory block selection signal;

means for selecting a first substitute word element from the second spare memory array in response to said memory block selection signal concurrently with selection of the first word element from the first memory array;

second outputting means for outputting the first substitute word element from the second spare memory array to a second intermediate bus in response to said memory array block selection signal concurrently with an output of the first word element to the first intermediate bus;

means for generating a substitution signal representative of a defective first word element; and means for selectively communicating a content of one the first and second intermediate busses to a common data bus in accordance with the substitution signal.

5. The semiconductor memory device of claim 4 wherein the means for generating a substitution signal includes,
means for decoding an address signal, and
means for storing data representative of a defective memory element corresponding to a decoded address signal.

6. The semiconductor memory device of claim 5 wherein the means for storing data representative of a defective memory element is comprised of a fuse which is selectively blown to represent a defective memory element.

7. The semiconductor memory device of claim 6 further comprising:
first and second address signal lines corresponding to the first and second memory blocks, wherein the first and second outputting means are activated by an address signal provided on either of the first and second address signal lines, whereby data is presented to the first intermediate bus through the first outputting means and to the second intermediate bus through the second outputting means in accordance with a signal on either of the first and second signal lines.

8. The semiconductor memory device of claim 7 wherein the means for selectively communicating a content of one of the first and second intermediate busses to a common data bus includes,
a first sense amplifier operatively connected between the first intermediate bus and the common data bus,
a second sense amplifier operatively connected between the second intermediate bus and the common data bus, means for enabling the first sense amplifier and disabling the second sense amplifier in the event that the first address line is selected and a substitution signal is not generated, and means for disabling the first sense amplifier and enabling the second sense amplifier in the event that the first address line is selected and the substitution signal is generated.

9. The semiconductor memory device of claim 8 wherein:

the second outputting means includes means for outputting a second word element from the second memory array to the second intermediate bus; and the first outputting means includes means for outputting a second substitute word element from the first spare memory array to the first intermediate bus concurrently with an output of the second word element to the second intermediate bus.

10. The semiconductor memory device of claim 9 wherein the means for selectively communicating a content of one of the first and second intermediate busses further includes:

means for enabling the second sense amplifier and disabling the first sense amplifier in the event that the second address line is selected and a substitution signal is not generated; and means for disabling the second sense amplifier and enabling the first sense amplifier in the event that the second address line is selected and a substitution signal is generated.

11. A method for masking a defective memory element in a dual block memory device comprising the steps of:

selecting a first word element from a plurality of memory cells of a memory array of a first memory block in response to a memory array block selection signal;

outputting the first word element to a first intermediate bus in response to said memory array block selection signal;

selecting a first substitute word element from a spare memory array of a second memory block in response to said memory array block selection signal concurrently with selection of the first word element from the memory array of the first memory block;

outputting the first substitute word element from the second spare memory array of the second memory block to a second intermediate bus in response to said memory array block selection signal concurrently with an output of the first word element to the first intermediate bus;

generating a substitution signal representative of a defective first word element; and selectively communicating a content of one of the first and second intermediate busses to a common data bus in accordance with the substitution signal.

12. The method of claim 11 further comprising the steps of:

decoding an address signal representative of a location of the first word element in the first memory array;

comparing a decoded address signal to data representative of defective word locations;

generating the substitution signal in accordance with a comparing of the decoded address signal.

13. The method of claim 12 wherein the step of selectively communicating a content of one of the first and second intermediate busses to a common data bus includes the steps of:

enabling a first sense amplifier operatively connecting the first intermediate bus and the common data bus in the event that the substitution signal is not generated; and enabling a second sense amplifier operatively connected the second intermediate bus and the common data bus in the event that the substitution signal is generated.

14. The method of claim 13 further comprising the steps of:

selecting a second word element from a plurality of memory cells of a memory array of the second memory block;

outputting the second word element to the second intermediate bus;

selecting a second substitute word element from a spare memory array of the first memory block concurrently with selection of the second word element from the memory array of the second memory block; and outputting the second substitute word element from the spare memory array of the first memory block to the first intermediate bus concurrently with an output of the second word element to the second intermediate bus.

15. A semiconductor memory device comprising:

N selectable memory blocks, wherein N is defined as an integer value greater than two, each of the N memory blocks including, a memory array having a plurality of memory cells arranged as a series of selectively addressable word elements, and a spare memory array having a series of memory elements arranged as at least one selectively addressable spare word element;

a common data bus;

N selectively operable sense amplifiers operatively connecting each memory block with the common data bus, inputs of each of the N selectively operable sense amplifiers being coupled to each of the N memory blocks and outputs of each of the N selectively operable sense amplifiers being commonly to the common data bus;

N block selection lines operatively connected to each of the N memory blocks;

means for simultaneously addressing a selected word element from a memory array of a selected any one memory block and a selected spare word element from a spare memory array of a different memory block;

means for storing data representative of a defective word elements;

address comparison means for comparing an address of the selected word element to the data representative of defective word elements;

means selectively enabling sense amplifiers associated with one of the selected word element and the selected spare word element in accordance with an output of the address comparison means.

16. The semiconductor memory device of claim 15 wherein the address comparison means is comprised of an address decoder and a fuse which is selectively blown in the event that a word element represented by a decoded address is determined to be defective.

* * * * *